United States Patent
Qin et al.

(10) Patent No.: US 12,200,970 B2
(45) Date of Patent: Jan. 14, 2025

(54) DISPLAY PANEL HAVING DISPLAY AREAS WITH DIFFERENT TRANSMITTANCES

(71) Applicant: KunShan Go-Visionox Opto-Electronics Co., Ltd, Jiangsu (CN)

(72) Inventors: Xu Qin, Kunshan (CN); Chuanzhi Xu, Kunshan (CN); Lu Zhang, Kunshan (CN); Siming Hu, Kunshan (CN); Zhenzhen Han, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 434 days.

(21) Appl. No.: 17/535,820

(22) Filed: Nov. 26, 2021

(65) Prior Publication Data
US 2022/0085116 A1    Mar. 17, 2022

Related U.S. Application Data

(63) Continuation of application No. PCT/CN2020/108406, filed on Aug. 11, 2020.

(30) Foreign Application Priority Data

Nov. 29, 2019 (CN) .......................... 201911205752.0

(51) Int. Cl.
*H10K 59/121* (2023.01)
*H10K 50/818* (2023.01)
(Continued)

(52) U.S. Cl.
CPC ......... *H10K 59/121* (2023.02); *H10K 50/818* (2023.02); *H10K 59/122* (2023.02); *H10K 59/65* (2023.02)

(58) Field of Classification Search
None
See application file for complete search history.

(56) References Cited

U.S. PATENT DOCUMENTS

| 11,968,873 B2 * | 4/2024 | Lou ........................... G09F 9/30 |
| 2011/0229994 A1 * | 9/2011 | Jung ................... H10K 50/852 |
| | | 257/E33.068 |

(Continued)

FOREIGN PATENT DOCUMENTS

| CN | 107275360 A | 10/2017 |
| CN | 108717244 A | 10/2018 |

(Continued)

OTHER PUBLICATIONS

The International search report for PCT Application No. PCT/CN2020/108406, dated Oct. 30, 2020, 14 pages.

(Continued)

*Primary Examiner* — Suberr L Chi
(74) *Attorney, Agent, or Firm* — Maier & Maier, PLLC

(57) ABSTRACT

The present application discloses a display panel and a display apparatus. The display panel includes: a first display area and a second display area, a transmittance of the first display area is greater than a transmittance of the second display area; and a plurality of first sub-pixels located in the first display area and each of the plurality of the first sub-pixels includes a first electrode, a first light-emitting structure located on the first electrode, and a second electrode located on the first light-emitting structure, in which a ratio of a total area of first electrodes of the plurality of the first sub-pixels located in the first display area to an area of the first display area is in a range from 8% to 23%.

20 Claims, 3 Drawing Sheets

(51) Int. Cl.
*H10K 59/122* (2023.01)
*H10K 59/65* (2023.01)

(56) References Cited

U.S. PATENT DOCUMENTS

| | | | |
|---|---|---|---|
| 2015/0021580 A1 | 1/2015 | Ha et al. | |
| 2017/0200778 A1* | 7/2017 | Jeon | H10K 59/1201 |
| 2019/0082519 A1* | 3/2019 | Gagne-Keats | G01J 3/2803 |
| 2020/0251539 A1* | 8/2020 | Fu | H10K 59/179 |
| 2021/0366890 A1* | 11/2021 | Li | H01L 25/18 |

FOREIGN PATENT DOCUMENTS

| | | |
|---|---|---|
| CN | 109274876 A | 1/2019 |
| CN | 109801950 A | 5/2019 |
| CN | 110189639 A | 8/2019 |
| CN | 110190099 A | 8/2019 |
| CN | 110190103 A | 8/2019 |
| CN | 110289298 A | 9/2019 |
| CN | 110783394 A | 2/2020 |
| CN | 210575958 U | 5/2020 |
| CN | 111312755 A | 6/2020 |
| TW | 201939785 A | 10/2019 |

OTHER PUBLICATIONS

The First Office Action for Chinese Application No. 201911205752.0, dated Oct. 10, 2020, 21 pages.
Notification to Grant Patent Right for Invention for Chinese Application No. 201911205752.0, dated May 19, 2021, 6 pages.
The Second Office Action for Chinese Application No. 201911205752.0, dated Dec. 28, 2020, 15 pages.
The Third Office Action for Chinese Application No. 201911205752.0, dated Mar. 9, 2021, 10 pages.

* cited by examiner

DISPLAY PANEL HAVING DISPLAY AREAS WITH DIFFERENT TRANSMITTANCES

CROSS REFERENCE TO RELATED APPLICATION

The present application is a continuation of International Application No. PCT/CN2020/108406 filed on Aug. 11, 2020, which claims the benefit of priority to Chinese Patent Application No. 201911205752.0 filed on Nov. 29, 2019, both of which are incorporated herein by reference in their entireties.

TECHNICAL FIELD

The present application relates to the field of display, and particularly to a display panel and a display apparatus.

BACKGROUND

With the rapid development of electronic devices, demands of users for the screen-to-body ratio are higher and higher, resulting in that the full-screen display of electronic devices attracts more and more attention in the industry.

Traditional electronic devices such as a cell phone and a tablet computer needs to integrate a front camera, a telephone receiver, an infrared sensing component and the like. In the prior art, a notch or a hole is formed in the display screen so that external light can enter the photosensitive component under the screen through the notch or the hole. Nonetheless, these electronic devices do not achieve a real full-screen display, and cannot display an image in all areas of the entire screen. For example, the area corresponding to the front camera cannot display the image.

SUMMARY

The embodiments of the present application provide a display panel and a display apparatus, in which at least part of area of the display panel can transmit light and be used for display, thereby facilitating an under-screen integration of the photosensitive component.

In one aspect, the embodiments of the present application provide a display panel comprising: a first display area and a second display area, a transmittance of the first display area being greater than a transmittance of the second display area; and a plurality of first sub-pixels located in the first display area and each of the plurality of the first sub-pixels comprising a first electrode, a first light-emitting structure located on the first electrode, and a second electrode located on the first light-emitting structure; wherein a ratio of a total area of first electrodes of the plurality of the first sub-pixels located in the first display area to an area of the first display area is in a range from 8% to 23%.

According to the display panel of the embodiments of the present application, the transmittance of the first display area is greater than the transmittance of the second display area, so that a photosensitive component can be integrated on the rear of the first display area of the display panel. The under-screen integration is achieved for the photosensitive component such as a camera, and moreover, the first display area can display the image, thus the display area of the display panel is increased, and a full-screen design is achieved for the display apparatus. The ratio of the total area of the first electrodes of the plurality of the first sub-pixels located in the first display area to the area of the first display area is in a range from 8% to 23%, and the area of the first electrode can ensure that the first display area has a better display effect and the first sub-pixel has a longer service life, and moreover, the first display area can have a sufficient light-transmitting performance. When the photosensitive component is integrated on the rear of the first display area, the photosensitive property of the photosensitive component can be improved.

In another aspect, the embodiments of the present application provide a display apparatus comprising: the display panel of any one of the above embodiments comprising a first surface and a second surface opposing to each other, wherein the first surface is a display surface and the second surface is a rear of the display panel; and a photosensitive component located under the first display area of the display panel, i.e., close to a side corresponding to the second surface.

According to the display apparatus of the embodiments of the present application, the ratio of the total area of the first electrodes of the plurality of the first sub-pixels located in the first display area of the display panel to the area of the first display area is in a range from 8% to 23%, and the area of the first electrode can ensure that the first display area has a better display effect and the first sub-pixel has a longer service life, and moreover, the first display area can have a sufficient light-transmitting performance, thus the photosensitive property of the photosensitive component is improved.

BRIEF DESCRIPTION OF THE DRAWINGS

Other features, objects, and advantages of the present application will become more apparent by reading the following detailed description of non-limiting embodiments with reference to the accompanying drawings, in which the same or similar reference numerals represent the same or similar features. The accompanying drawings are not drawn to actual scale.

DETAILED DESCRIPTION

In order to make the objects, technical solutions, and advantages of the present application clearer, the present application will be further described in detail below with reference to the accompanying drawings and specific embodiments. It is understood that the specific embodiments described herein are merely configured to explain the present application, rather than to limit the present application. For those skilled in the art, the present application can be implemented without some of these specific details.

In an electronic device such as a cell phone and a tablet computer, it is needed to integrate a photosensitive component such as a front camera, an infrared light sensor, and a proximity light sensor at the side where the display panel is arranged. In some embodiments, a light-transmitting display area may be arranged in the above electronic device, and the photosensitive component is arranged on the rear of the light-transmitting display area. A full-screen display is achieved for the electronic device while the photosensitive component is guaranteed to work normally.

In order to form the above light-transmitting display area, the transmittance of each film layer in the light-transmitting display area needs to be increased. Nonetheless, in order to ensure that the display chromaticity of the light-transmitting display area tends to be consistent with that of the non-light-transmitting display area, the material of anode of the sub-pixel in the light-transmitting display area need to be configured as the same as the material of anode of the sub-pixel in the non-light-transmitting display area, and in this case, the anode of the sub-pixel in the light-transmitting display area generally utilizes non-light-transmitting material.

Under a condition that the anode of the sub-pixel in the light-transmitting display area does not transmit light, if the area of the anode is too small, the service life and the display effect of the sub-pixel cannot be guaranteed, and if the area of the anode is too large, the transmittance of the light-transmitting display area will be adversely affected. Therefore, it is desired to reasonably configure the area of electrode of the sub-pixel in the light-transmitting display area.

In order to solve the above problems, the embodiments of the present application provide a display panel and a display apparatus, which will be described below with reference to the drawings.

The embodiments of the present application provide a display panel, which may be an organic light emitting diode (Organic Light Emitting Diode, OLED) display panel.

Figure 1:
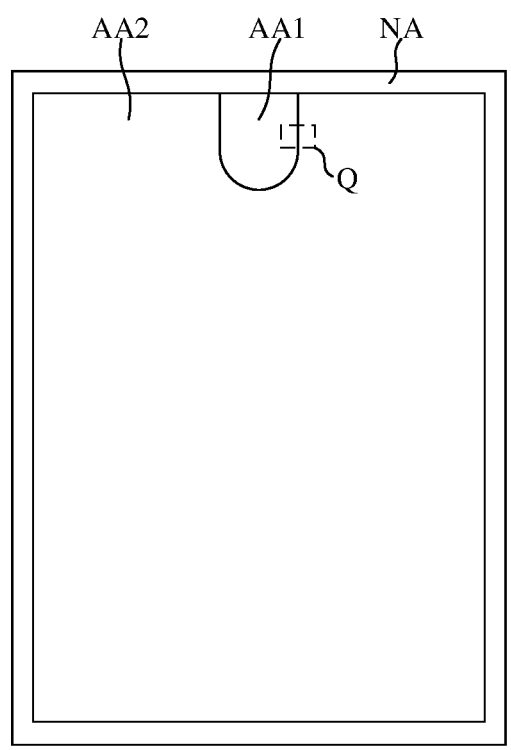
FIG. 1 shows a top view of a display panel provided according to an embodiment of the present application.
Figure 2:
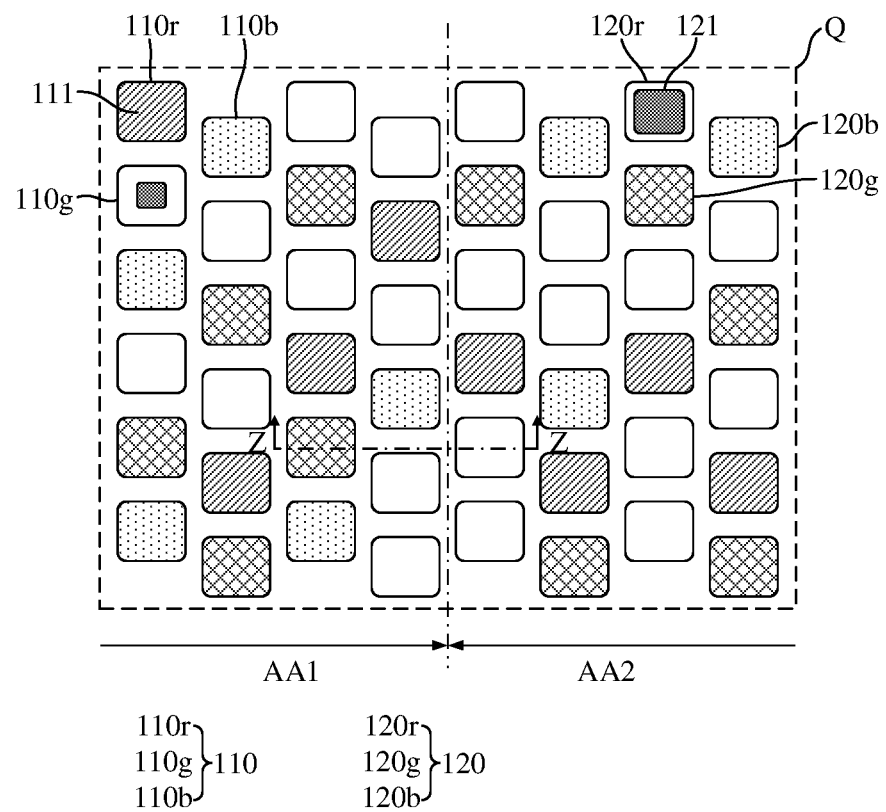
FIG. 2 shows a partial enlarged schematic diagram of the area Q in FIG. 1 of an example.
Figure 3:
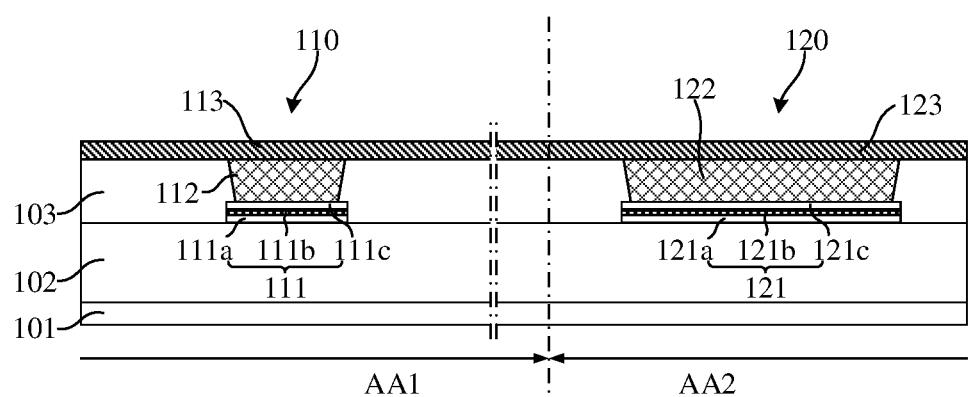
FIG. 3 shows a cross-sectional view taken along the line Z-Z in FIG. 2.

FIG. 1 shows a top view of a display panel provided according to an embodiment of the present application, FIG. 2 shows a partial enlarged schematic diagram of the area Q in FIG. 1 of an example, and FIG. 3 shows a cross-sectional view taken along the line Z-Z in FIG. 2. The display panel 100 includes a first display area AA1, a second display area AA2, and a non-display area NA surrounding the first display area AA1 and the second display area AA2, and the transmittance of the first display area AA1 is greater than the transmittance of the second display area AA2.

In the present application, the transmittance of the first display area AA1 is greater than or equal to 15%. To ensure that the transmittance of the first display area AA1 is greater than or equal to 15%, or even greater than 40%, or even a higher transmittance, the transmittance of at least part of functional films of the display panel 100 in the embodiment is greater than 80%, and even the transmittance of at least part of the functional films is greater than 90%.

The display panel 100 includes a plurality of first sub-pixels 110 located in the first display area AA1. Each of the plurality of the first sub-pixels 110 includes a first electrode 111, a first light-emitting structure 112 located on the first electrode 111, and a second electrode 113 located on the first light-emitting structure 112. One of the first electrode 111 and the second electrode 113 is an anode, and the other is a cathode. Herein, a ratio of a total area of first electrodes 111 of the plurality of the first sub-pixels 110 located in the first display area AA1 to an area of the first display area AA1 is in a range from 8% to 23%.

According to the display panel 100 of the embodiments of the present application, the ratio of the total area of the first electrodes 111 of the plurality of the first sub-pixels 110 located in the first display area AA1 to the area of the first display area AA1 is in a range from 8% to 23%, and the area of the first electrode 111 can ensure that the first display area AA1 has a better display effect and the first sub-pixel 110 has a longer service life, and moreover, the first display area AA1 can have a sufficient light-transmitting performance. When the photosensitive component is integrated on the rear of the first display area AA1, the photosensitive property of the photosensitive component can be improved.

Optionally, the ratio of the total area of the first electrodes 111 of the plurality of the first sub-pixels 110 located in the first display area AA1 to the area of the first display area AA1 is in a range from 15% to 20%, which further improves the display effect and the light-transmitting performance of the display panel 100.

In the embodiment, the plurality of the first sub-pixels 110 are classified as first red sub-pixels 110r, first green sub-pixels 110g, and first blue sub-pixels 110b according to different colors of emitted light. In the first display area AA1, a ratio among a total area of first electrodes 111 of the first red sub-pixels 110r, a total area of first electrodes 111 of the first green sub-pixels 110g, and a total area of first electrodes 111 of the first blue sub-pixels 110b is 1:1.9:1.7, so that the ratio of the first electrodes 111 in the sub-pixels of various colors of the first display area AA1 is more coordinated, color cast of the first display area AA1 is reduced, and moreover, the consistency of life decay of the sub-pixels of various colors is improved.

The display panel 100 further includes a plurality of second sub-pixels 120 located in the second display area AA2. Each of the plurality of the second sub-pixels 120 includes a third electrode 121, a second light-emitting structure 122 located on the third electrode 121, and a fourth electrode 123 located on the second light-emitting structure 122. One of the third electrode 121 and the fourth electrode 123 is an anode, and the other is a cathode.

Optionally, an area of the first electrode 111 of each of the plurality of the first sub-pixels 110 is smaller than an area of the third electrode 121 of each of the plurality of the second sub-pixels with a same color. By reducing the area of the first electrode 111 of each of the plurality of the first sub-pixels 110, the light-transmitting performance of the first display area AA1 is improved, and thus the photosensitive property of the photosensitive component is improved.

In the embodiment, for example, the first electrode 111 and the third electrode 121 are anodes, and the second electrode 113 and the fourth electrode 123 are cathodes.

The first light-emitting structure 112 and the second light-emitting structure 122 may each include an emitting layer (Emitting Layer, EML). According to the design requirements of the first light-emitting structure 112 and the second light-emitting structure 122, the first light-emitting structure 112 and the second-light emitting structure 122 each may further include at least one of a hole inject layer (Hole Inject Layer, HIL), a hole transport layer (Hole Transport Layer, HTL), an electron inject layer (Electron Inject Layer, EIL) or an electron transport layer (Electron Transport Layer, ETL).

Optionally, the first electrode 111 and the third electrode 121 have a same layer structure, so that the chromaticity of the first sub-pixels 110 and the chromaticity of the second sub-pixels 120 with a same color tend to be consistent. The third electrode 121 may be a reflective electrode. Optionally, the first electrode 111 is a reflective electrode.

In the embodiment, the first electrode 111 includes a first light-transmitting conductive layer 111a, a first reflective layer 111b located on the first light-transmitting conductive layer 111a, and a second light-transmitting conductive layer 111c located on the first reflective layer 111b.

In the embodiment, the third electrode 121 includes a third light-transmitting conductive layer 121a, a second reflective layer 121b located on the third light-transmitting conductive layer 121a, and a fourth light-transmitting conductive layer 121c located on the second reflective layer 121b.

The first light-transmitting conductive layer 111a, the second light-transmitting conductive layer 111c, the third light-transmitting conductive layer 121a, and the fourth light-transmitting conductive layer 121c may be an indium tin oxide (Indium Tin Oxide, ITO) layer, an indium zinc oxide (Indium Zinc Oxide, IZO) layer, etc., and the first reflective layer 111b and the second reflective layer 121b may be a metal layer, for example, made of silver.

Optionally, the display panel 100 includes a substrate 101 and a pixel defining layer 103, and moreover, a device layer 102.

The substrate 101 may be made of a light-transmitting material such as glass, Polyimide (Polyimide, PI). The pixel defining layer 103 is located on the substrate 101. The pixel defining layer 103 includes a plurality of first pixel openings located in the first display area AA1, in which each of the plurality of the first pixel openings accommodates the first light-emitting structure 112 of a corresponding first sub-pixel 110. The pixel defining layer 103 may include a plurality of second pixel openings located in the second display area AA2, in which each of the plurality of the second pixel openings accommodates the second light-emitting structure 122 of a corresponding second sub-pixel 120.

The device layer 102 is located between the substrate 101 and the pixel defining layer 103. The device layer 102 includes a first pixel circuit electrically connected with the first electrodes 111 of the plurality of the first sub-pixels 110 and configured to drive the first sub-pixels 110 for display.

Optionally, the device layer 102 includes a second pixel circuit electrically connected with the third electrodes 121 of the plurality of the second sub-pixels 120 and configured to drive the second sub-pixels 120 for display. The second pixel circuit may be located in the second display area AA2.

Optionally, the second display area AA2 includes a transition display area adjacent to the first display area AA1, and the first pixel circuit is located in the transition display area, thus the wiring structure of the first display area AA1 is reduced and the light-transmitting performance of the first display area AA1 is improved.

Optionally, an orthographic projection of each of the first electrodes 111 on the substrate 101 consists of one first graphic unit or two or more first graphic units jointed together, and the first graphic unit includes at least one selected from a group including a round shape, an oval shape, a dumb-bell shape, a gourd shape and a rectangle shape.

Optionally, an orthographic projection of the first light-emitting structure 112 on the substrate 101 consists of one second graphic unit or two or more second graphic units jointed together, and the second graphic unit includes at least one selected from a group including a round shape, an oval shape, a dumb-bell shape, a gourd shape and a rectangle shape.

According to the above embodiments, by reasonably configuring shapes of the first electrode 111 and the first light-emitting structure 112, diffraction of the first display area AA1 can be effectively reduced.

The embodiments of the present application further provide a display apparatus which may include the display panel 100 of any one of the above embodiments. A display apparatus of an embodiment will be described below as an example, in which the display apparatus includes the display panel 100 of the above embodiments.

Figure 4:
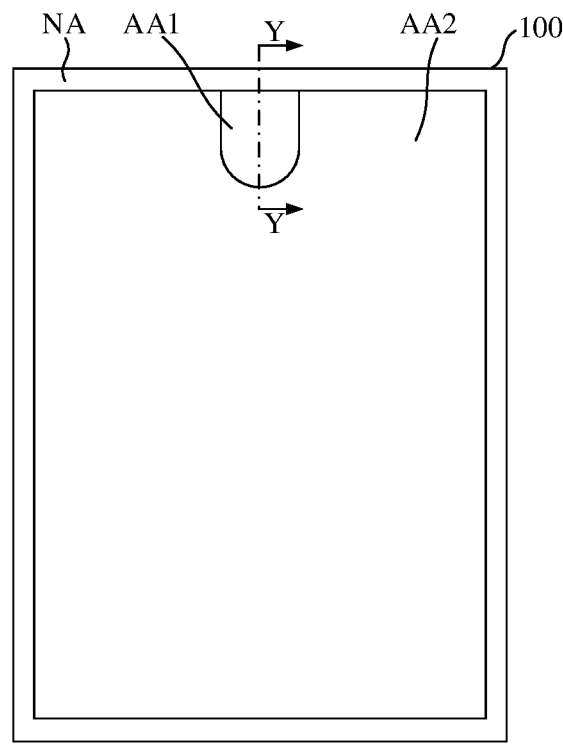
FIG. 4 shows a top view of a display apparatus provided according to an embodiment of the present application.
Figure 5:
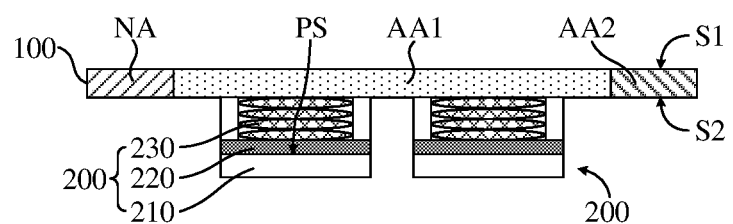
FIG. 5 shows a cross-sectional view taken along the line Y-Y in FIG. 4.

FIG. 4 shows a top view of a display apparatus provided according to an embodiment of the present application, and FIG. 5 shows a cross-sectional view taken along the line Y-Y in FIG. 4. In the display apparatus of the embodiment, the display panel 100 may be the display panel 100 of one of the above embodiments, in which the display panel 100 includes a first display area AA1 and a second display area AA2, and the transmittance of the first display area AA1 is greater than the transmittance of the second display area AA2.

The display panel 100 includes a first surface S1 and a second surface S2 opposing to each other, in which the first surface S1 is a display surface and the second surface S2 is a rear of the display panel 100. The display apparatus further includes a photosensitive component 200 located under the first display area AA1 of the display panel 100, that is, the photosensitive component 200 is located at the side corresponding to the second surface S2 of the first display area AA1 of the display panel 100.

The photosensitive component 200 may be an image capturing component for capturing external image information. In the embodiment, the photosensitive component 200 is a complementary metal oxide semiconductor (Complementary Metal Oxide Semiconductor, CMOS) image capturing component, and in some other embodiments, the photosensitive component 200 may also be other image capturing components such as a charge-coupled device (Charge-coupled Device, CCD) image capturing component. It may be appreciated that the photosensitive component 200 may not be limited to an image capturing component. For example, in some embodiments, the photosensitive component 200 may also be a light sensor such as an infrared sensor, a proximity sensor, an infrared lens, a flood light sensing element, an ambient light sensor and a dot projector. In addition, other components such as a telephone receiver and a speaker may also be integrated on the second surface S2 of the display panel 100 of the display apparatus.

According to the display apparatus of the embodiments of the present application, the transmittance of the first display area AA1 is greater than the transmittance of the second display area AA2, so that the photosensitive component 200 may be integrated on the rear of the first display area AA1 of the display panel 100. An under-screen integration is achieved for the photosensitive component 200 such as an image capturing component, and moreover, the first display area AA1 can display the image, the display area of the display panel 100 is increased and a full-screen design is achieved for the display apparatus.

The display panel 100 includes a plurality of first sub-pixels 110 located in the first display area AA1. Each of the plurality of the first sub-pixels 110 includes a first electrode 111, a first light-emitting structure 112 located on the first electrode 111, and a second electrode 113 located on the first light-emitting structure 112. The ratio of the total area of first electrodes 111 of the plurality of the first sub-pixels 110 located in the first display area AA1 to the area of the first display area AA1 is in a range from 8% to 23%, and the area of the first electrode 111 can ensure that the first display area AA1 has a better display effect and the first sub-pixel 110 has a longer service life, and moreover, the first display area AA1 can have a sufficient light-transmitting performance, and thus the photosensitive property of the photosensitive component 200 can be improved.

In the embodiment, the photosensitive component 200 is described by taking the image capturing component as an example, and if the display apparatus is a cell phone, the image capturing component is a front camera.

Optionally, the ratio of the total area of the first electrodes 111 of the plurality of the first sub-pixels 110 located in the first display area AA1 to the area of the first display area AA1 is in a range from 15% to 23%, and the number of the photosensitive components 200 is two or more, thus a reduction of light-transmitting capability of the first display area AA1 can be compensated to ensure that the photosensitive component 200 can still obtain better photosensitive information.

Optionally, the photosensitive component 200 includes a photosensitive chip 210, an infrared cut-off filter 220, and a lens group 230. The photosensitive chip 210 has a photosensitive surface PS. The infrared cut-off filter 220 is located on the photosensitive surface PS of the photosensitive chip 210. The lens group 230 is located at a side of the infrared cut-off filter 220 away from the photosensitive surface PS.

Optionally, the infrared cut-off filter 220 is a blue glass infrared cut-off filter 220 which can absorb infrared light, thus reflection and refraction of infrared light at the lens group 230 are greatly reduced, thereby reducing the halo formation, the dark corner formation, and the red dot formation of the photosensitive component 200.

Optionally, the aperture of the photosensitive component 200 may be enlarged to increase the amount of light entering the photosensitive surface PS of the photosensitive chip 210 and increase the sensitivity of the photosensitive component 200.

Optionally, the lens group 230 is a combination of multiple layers of lens so as to effectively filter stray light and improve the purity of the photosensitive component 200.

The above embodiments of the present application do not exhaustively describe all the details, nor do they limit the present application to merely the specific embodiments described. Obviously, according to the above description, many modifications and changes can be made. These embodiments are selected and specifically described in the specification to better explain the principles and practical applications of the present application, so that those skilled in the art are able to make good use of the present application and make modifications on the basis of the present application. The present application is only defined by the claims and their full scope and equivalents.

What is claimed is:

1. A display panel, comprising:
    a substrate;
    a first display area and a second display area, a transmittance of the first display area being greater than a transmittance of the second display area;
    a plurality of first sub-pixels located in the first display area and each of the plurality of the first sub-pixels comprising a first electrode, a first light-emitting structure located on the first electrode, and a second electrode located on the first light-emitting structure; wherein a ratio of a total area of first electrodes of the plurality of the first sub-pixels located in the first display area to an area of the first display area is in a range from 8% to 23%;
    a pixel defining layer located on the substrate, wherein the pixel defining layer comprises a plurality of first pixel openings located in the first display area and each first pixel opening of the plurality of the first pixel openings accommodates a light-emitting structure of a corresponding first sub-pixel; and
    a device layer located between the substrate and the pixel defining layer, wherein the device layer comprises a first pixel circuit electrically connected with the first electrodes of the plurality of the first sub-pixels.

2. The display panel of claim 1, wherein the ratio of the total area of the first electrodes of the plurality of the first sub-pixels located in the first display area to the area of the first display area is in a range from 15% to 20%.

3. The display panel of claim 1, wherein the plurality of the first sub-pixels are classified as first red sub-pixels, first green sub-pixels, and first blue sub-pixels according to different colors of emitted light, and in the first display area, a ratio among a total area of first electrodes of the first red sub-pixels, a total area of first electrodes of the first green sub-pixels, and a total area of first electrodes of the first blue sub-pixels is 1:1.9:1.7.

4. The display panel of claim 1, further comprising:
    a plurality of second sub-pixels located in the second display area and each of the plurality of the second sub-pixels comprising a third electrode, a second light-emitting structure located on the third electrode, and a fourth electrode located on the second light-emitting structure, wherein an area of the first electrode of each of the plurality of the first sub-pixels is smaller than an area of the third electrode of each of the plurality of the second sub-pixels with a same color.

5. The display panel of claim 4, wherein the first electrode and the third electrode have a same layer structure.

6. The display panel of claim 1, wherein the transmittance of the first display area is greater than or equal to 15%.

7. The display panel of claim 1, wherein the first electrode is a reflective electrode.

8. The display panel of claim 7, wherein the first electrode comprises a first light-transmitting conductive layer, a reflective layer located on the first light-transmitting conductive layer, and a second light-transmitting conductive layer located on the reflective layer.

9. The display panel of claim 1, wherein the second display area comprises a transition display area adjacent to the first display area, and the first pixel circuit is located in the transition display area.

10. The display panel of claim 1, wherein an orthographic projection of each of the first electrodes on the substrate consists of one first graphic unit or two or more first graphic units jointed together, and the first graphic unit comprises at least one selected from a group comprising a round shape, an oval shape, a dumb-bell shape, a gourd shape, and a rectangle shape.

11. The display panel of claim 1, wherein an orthographic projection of the first light-emitting structure on the substrate consists of one second graphic unit or two or more second graphic units jointed together, and the second graphic unit comprises at least one selected from a group comprising a round shape, an oval shape, a dumb-bell shape, a gourd shape, and a rectangle shape.

12. A display apparatus, comprising:
    the display panel of claim 1; and
    a photosensitive component located under the first display area of the display panel.

13. The display apparatus of claim 12, wherein the ratio of the total area of the first electrodes of the plurality of the first sub-pixels located in the first display area to the area of the first display area is in a range from 15% to 23%.

14. The display apparatus of claim 12, wherein the photosensitive component comprises:
    a photosensitive chip having a photosensitive surface;
    an infrared cut-off filter located on the photosensitive surface of the photosensitive chip; and
    a lens group located at a side of the infrared cut-off filter away from the photosensitive surface.

15. A display panel, comprising:
a substrate;
a first display area and a second display area, a transmittance of the first display area being greater than a transmittance of the second display area;
a plurality of first sub-pixels located in the first display area and each of the plurality of the first sub-pixels comprising a first electrode, a first light-emitting structure located on the first electrode, and a second electrode located on the first light-emitting structure;
a pixel defining layer located on the substrate, wherein the pixel defining layer comprises a plurality of first pixel openings located in the first display area and each first pixel opening of the plurality of the first pixel openings accommodates a light-emitting structure of a corresponding first sub-pixel; and
a device layer located between the substrate and the pixel defining layer, wherein the device layer comprises a first pixel circuit electrically connected with the first electrodes of the plurality of the first sub-pixels.

16. The display panel of claim 15, further comprising:
a plurality of second sub-pixels located in the second display area and each of the plurality of the second sub-pixels comprising a third electrode, a second light-emitting structure located on the third electrode, and a fourth electrode located on the second light-emitting structure, wherein an area of the first electrode of each of the plurality of the first sub-pixels is smaller than an area of the third electrode of each of the plurality of the second sub-pixels with a same color.

17. The display panel of claim 16, wherein the first electrode and the third electrode have a same layer structure.

18. The display panel of claim 15, wherein the first electrode comprises a first light-transmitting conductive layer, a reflective layer located on the first light-transmitting conductive layer, and a second light-transmitting conductive layer located on the reflective layer.

19. The display panel of claim 15, wherein an orthographic projection of each of the first electrodes on the substrate consists of one first graphic unit or two or more first graphic units jointed together, and the first graphic unit comprises at least one selected from a group comprising a round shape, an oval shape, a dumb-bell shape, a gourd shape, and a rectangle shape.

20. The display panel of claim 15, wherein an orthographic projection of the first light-emitting structure on the substrate consists of one second graphic unit or two or more second graphic units jointed together, and the second graphic unit comprises at least one selected from a group comprising a round shape, an oval shape, a dumb-bell shape, a gourd shape, and a rectangle shape.

* * * * *